United States Patent [19]

Arndt

[11] 3,772,160

[45] Nov. 13, 1973

[54] METHOD OF ELECTROFORMING A PRINTING SCREEN

[75] Inventor: Lloyd G. Arndt, St. Paul, Minn.

[73] Assignee: Buckbee-Mears Company, St. Paul, Minn.

[22] Filed: July 8, 1971

[21] Appl. No.: 160,826

[52] U.S. Cl. .............. 204/11, 101/128.2, 101/128.4, 204/16

[51] Int. Cl. .............. C23b 7/00, B30b 9/06

[58] Field of Search .............. 29/423, 424; 101/128.2, 127, 128.4; 204/11, 16, 43

[56] References Cited

UNITED STATES PATENTS

| | | | |
|---|---|---|---|
| 2,316,768 | 4/1943 | Brennan | 101/128.4 |
| 2,338,091 | 1/1944 | Brennan | 101/128.2 |
| 2,288,020 | 6/1942 | Noland et al. | 101/128.2 |
| 3,332,754 | 7/1967 | Dytrt | 204/43 |
| 3,342,706 | 9/1967 | Liben et al. | 204/3 |
| 3,482,300 | 12/1969 | Reinke | 101/128.4 |

*Primary Examiner*—T. Tufariello
*Attorney*—Stryrer & Jacobson

[57] ABSTRACT

A printing screen useful in silk screen printing art is produced by electrodepositing a layer of nickel onto a copper base and then depositing an alloy of tin and lead over the nickel followed by pressing a stainless steel screen into the alloy layer at the melting temperature of the alloy so as to laminate the screen to the nickel layer. The copper base is then etched away leaving only the nickel supported screen. The particular pattern to be printed is originally formed in plating resist on the copper base so as to exclude nickel from the areas of the screen corresponding to the pattern.

3 Claims, 8 Drawing Figures

INVENTOR
LLOYD G. ARNDT
BY Stryker & Jacobson
ATTORNEYS

METHOD OF ELECTROFORMING A PRINTING SCREEN

BACKGROUND OF THE INVENTION

In the art of silk screen printing, it is common to utilize a stainless steel fine wire mesh screen supported in some type of metallic frame. These screens are especially useful in the printed circuit art where patterns are placed on the screen to form masks through which a metallic paste such as a slurry of epoxy and metal powder is forced onto a circuit board. It is desirable that such a screen be rigidized by the application of a suitable electrodeposited layer of metal so as to bind the interwoven wires of the screen together into a relatively secure structure. Unfortunately, it has been found that in order to provide enough metal at the junctions of the individual wires to achieve the proper rigidizing a great amount of metal has to be plated onto the strands of the wire between the junctions. This excess plating tends to close the holes in the screen by too great a factor thus reducing the efficiency of the printing process. The present invention overcomes this problem while at the same time automatically providing a patterned metal mask for the printing screen.

SUMMARY OF THE INVENTION

Briefly, my invention contemplates coating a layer of nickel onto a copper base and electrodepositing a thin layer of a tin-lead eutectic. The screen covering layer is still too thin to rigidize the structure and, of course, does not close the holes in the screen to any appreciable extent. The screen is then laminated onto the tin-lead surface of the nickel plated copper block and the two are compressed together under a sufficient pressure and temperature to melt the screen into the layer of tin lead eutectic on the nickel. It has been found that a surface tension effect in this operation causes the melted tin-lead eutectic to flow toward the intersections or junctions of the wires in the screen thus providing a sufficient rigidizing connection between the interwoven screen wires and leaving only a minimum coating of eutectic on the wires between the intersections. Consequently, the intersections are made quite firm and the screen is rigidized without unnecessarily closing down the hole size of the screen. It is believed that the intersections of the screen tend to become hotter inducing a flow of the tin-lead alloy toward them since they constitute a higher point of contact between the heated compressing surfaces. Patterns may be automatically masked onto the nickel supported screen by reproducing the pattern in a suitable resist on the copper block before the application of the nickel layer. This prevents any electrodeposition of nickel in the areas where the pattern resist is laid down so that at the end of the manufacturing process when the copper block is etched away and the resist is removed, the pattern remains so that in the areas of the pattern, only the screen is present. It may, therefore, be seen that it is an object of my invention to provide an improved method for producing a partially masked printing screen. It is a further object of my invention to provide an improved screen which is suitably rigidized without causing the hole size to be substantially reduced. Further objects and advantages will become apparent upon consideration of the following description and drawings.

DESCRIPTION OF THE PREFERRED EMBODIMENT

Figure 1:
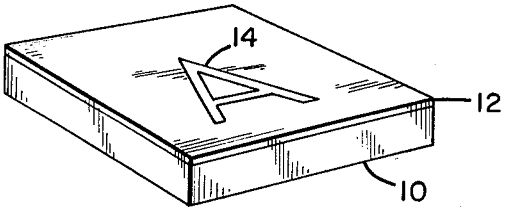
FIGS. 1 through 6 show the sequential steps involved in producing the rigidized printing screen of the present invention.
Figure 2:
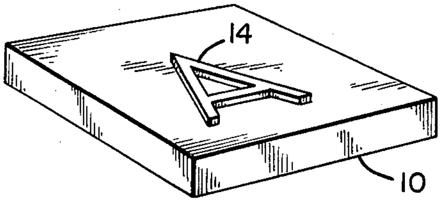

In FIG. 1, the first step in the production of the printing screen of my invention is shown. A layer of light sensitive enamel 12 is applied to a copper base 10. The pattern to be reproduced is then developed on the surface of the light sensitive enamel by shining a light through a pattern onto the enamel 12. In FIG. 1, the symbol A is being reproduced and is indicated by the number 14. After symbol 14 is imprinted on the layer of light sensitive enamel 12, the remaining enamel can be removed by a suitable solvent so as to produce just the symbol 14 on copper block 10 as shown in FIG. 2. The details of this process to this point are well known to those skilled in the art and therefore are omitted here.

Figure 3:
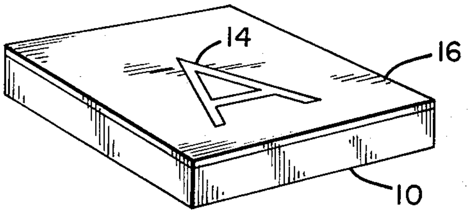

In FIG. 3, a layer of nickel has been electrodeposited onto the surface of copper block 10 so as to surround symbol 14. Nickel layer 16 will comprise the masking surface for the printing screen when the product is finished.

Figure 4:
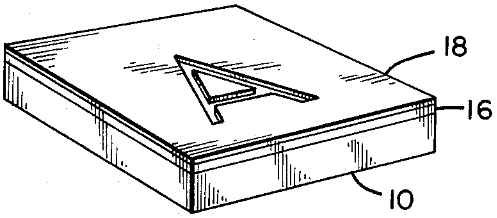

In FIG. 4, it may be seen that the next step involves a layer of a suitable eutectic alloy 18 which is electrodeposited onto the surface of nickel layer 16. Symbol 14, being formed by nonconducting resist remains uncovered during the electrodepositing process. Although any platable solder alloy may be utilized for layer 18, a mixture of approximately 60 percent tin with approximately 40 percent lead has been found to work well in the preferred embodiment. Layer 18 may be caused to have a thickness in the range of approximately 0.0002 of an inch whereas the nickel layer underneath may range anywhere from 0.0005 to 0.0010 of an inch in thickness.

Figure 5:
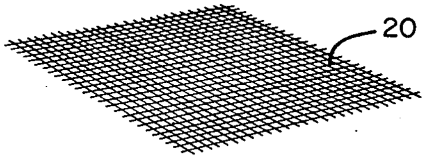
Figure 6:
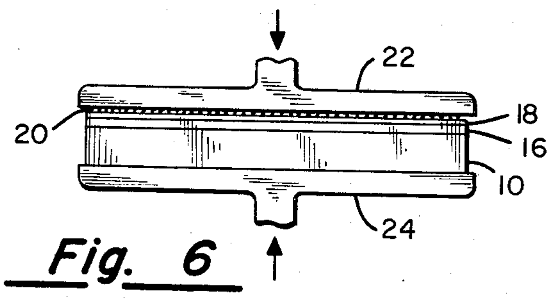

In FIG. 5, a typical fine wire mesh stainless steel screen is shown which has an electroplated coating of the same alloy which is used to produce layer 18 in FIG. 4. In this case, another tin-lead combination would be utilized. The tin-lead coated screen 20 of FIG. 5 is positioned on top of layer 18 and subjected to a press from both sides such as shown in FIG. 6 while being heated to approximately the melting point of tin-lead alloy. Pressures of anywhere from 10 to 125 pounds per square inch have been used with success in the preferred embodiment. Under pressure, as the temperature of the block reaches the melting point, the individual wire threads of screen mesh 20 sink through tin-lead layer 18 and come to rest directly against nickel layer 16. Since the intersection points in the wire mesh screen are a bit higher than the rest of the screen, they become somewhat hotter than the rest of the screen and the tin-lead layer 18 mixes with the tin-lead plating on screen 20 and flows predominently to the junctions of the various wire threads in the screen mesh. This tends to weld or solder each wire thread to its adjacent member thus rigidizing the whole screen structure. The flowing action generated by performing this process under compression and heating tends to keep most of the tin-lead alloy at the intersections of the wire mesh screen 20 thus leaving the holes open so they may readily pass ink or metallic paste during the printing process.

Figure 7:
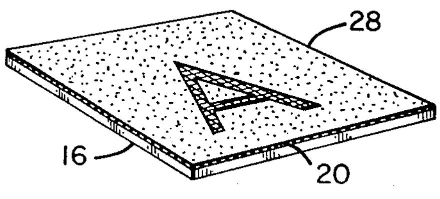
FIG. 7 shows in perspective, the final product as produced by the process of my invention.

The block is then removed from the heating and compressing means and allowed to cool. A layer of nickel is plated over the top surface of the screen so as to protect the layer of tin-lead on the screen from oxidization and damage. The copper base 10 is then etched away and a suitable solvent is used to remove the remaining resist forming symbol 14. The final product, shown in FIG. 7, comprises a mask of nickel having a screen 20 bonded thereto and extending across an A-shaped opening in nickel layer 16. This entire structure is flexible but the screen is sufficiently rigidized and fully open so as to be particularly useful in a silk screen printing process.

Figure 8:
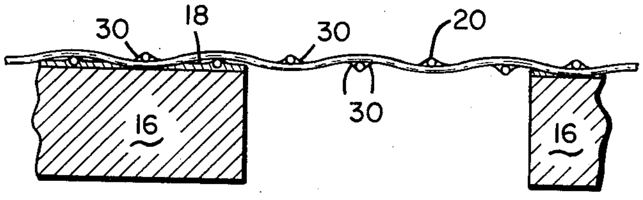
FIG. 8 shows a highly magnified sectional view of a small portion of the screen of FIG. 7 demonstrating how the eutectic layer flows so as to rigidize the screen without unduly closing the holes in the screen.

In FIG. 8, a highly magnified view of the edge of nickel layer 16 is shown. As can be seen from FIG. 8, screen 20 bridges across the gap 21 in the nickel mask layer representing whatever symbol is being reproduced. The screen wires are welded together by generous quantities of tin-lead alloy 30 at each junction indicated in FIG. 8. In addition, the screen is bonded to the surface of nickel layer 16 by its immersion in the thin layer of tin-lead 18. Thus, in one process it may be seen that the screen is provided with an ample support being bonded to a nickel layer 16 and, in addition, the screen is securely held together by tin-lead solder at each junction without any unnecessary closing of the holes between the wire threads in the screen mesh 20.

I claim:

1. A process for producing a printing screen comprising the steps of:

forming a desired symbol pattern on a surface of a base with resist;

plating a layer of nickel onto said base in those areas exclusive of said resist;

covering said layer of nickel with a thin layer of a low melting point alloy;

pressing a wire mesh screen into the surface of said low melting point alloy at a temperature near the melting point of said low melting point alloy so as to cause the alloy to flow predominently to the intersections of the wire mesh screen; and etching away the base block and dissolving out the resist.

2. The process of claim 1 including the step of electrodepositing a protective layer of nickel onto the screen's surface after said screen has been pressed into the low melting point alloy.

3. The process of claim 1 in which said low melting point alloy comprises a mixture of tin and lead.

* * * * *